United States Patent
Rouaissia

(10) Patent No.: US 10,136,399 B1
(45) Date of Patent: Nov. 20, 2018

(54) SINGLE SENSOR PROXIMITY DETECTOR

(71) Applicant: Semtech Corporation, Camarillo, CA (US)

(72) Inventor: Chaouki Rouaissia, Neuchâtel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 15/868,509

(22) Filed: Jan. 11, 2018

(30) Foreign Application Priority Data

May 16, 2017 (EP) .................................. 17171258

(51) Int. Cl.
| | | |
|---|---|---|
| *H01Q 11/12* | (2006.01) | |
| *H04B 1/04* | (2006.01) | |
| *H04W 52/38* | (2009.01) | |
| *H04B 1/02* | (2006.01) | |
| *G01D 5/24* | (2006.01) | |

(52) U.S. Cl.
CPC ............. *H04W 52/38* (2013.01); *G01D 5/24* (2013.01); *H04B 1/02* (2013.01)

(58) Field of Classification Search
CPC ............ H04W 52/38; G01D 5/24; H04B 1/02
See application file for complete search history.

(56) References Cited

U.S. PATENT DOCUMENTS

| | | |
|---|---|---|
| 2014/0015595 A1 | 1/2014 | Van Ausdall et al. |
| 2014/0323068 A1 | 10/2014 | Chang et al. |
| 2015/0171916 A1 | 6/2015 | Asrani et al. |
| 2016/0057578 A1 | 2/2016 | Rouaissia et al. |
| 2016/0065260 A1* | 3/2016 | Heikura ............... H04B 1/3838 455/575.5 |
| 2016/0165551 A1* | 6/2016 | Lagnado ............. H04W 52/283 370/311 |
| 2016/0366654 A1 | 12/2016 | Dervisogiu et al. |

FOREIGN PATENT DOCUMENTS

EP 3016286 A1 5/2016

OTHER PUBLICATIONS

European Search Report for EP Application No. 17209755.2, dated Jul. 3, 2018, 8 pages.

* cited by examiner

*Primary Examiner* — Nguyen Vo
(74) *Attorney, Agent, or Firm* — Blank Rome LLP

(57) ABSTRACT

A capacitive proximity detector for use in a connected portable device such as a telephone, laptop or tablet, in which the capacity seen by the sensor electrode is compared with four thresholds: a proximity threshold, set lower than the other, to generate a general proximity flag, and a body detection threshold set higher than the other arranged to generate a body detection flag that indicates that the object in proximity is a part of a human body. Two object detection thresholds in the region between the proximity threshold and the body threshold define a region in which the detector can decide whether the object in proximity is an inanimate object, based on the time variation of the capacity.

12 Claims, 2 Drawing Sheets

SINGLE SENSOR PROXIMITY DETECTOR

REFERENCE DATA

The present application claims priority from European Patent Application EP17171258.1 of May 16, 2017, the contents whereof are hereby incorporated by reference.

FIELD OF THE INVENTION

The present invention concerns a processor for processing the output of a proximity sensor, and to a smart proximity sensor that is combined with a processor that is arranged to output a signal that discriminates between the proximity to a human body and the proximity to an inanimate object. The present invention is concerned in particular, but not exclusively, with a connected portable device that is equipped with such a smart proximity sensor and is arranged to adapt the RF emitted from a radio interface in order to maintain a Specific Absorption Rate (SAR) within given limits.

DESCRIPTION OF RELATED ART

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with statutory SAR limits. Capacitive proximity detection is used also in touch-sensitive displays and panels.

Known capacitive sensing systems measure the capacity of an electrode and, when the device is placed in proximity of the human body (for example the hand, the head, or the lap) detect an increase in capacity. The variations in the sensor's capacity are relatively modest, and often amount to some percent of the "background" capacity seen by the sensor when no conductive body is in the proximity. Known capacitive detection systems may include a digital processor for subtracting drift and nose contributions and deliver a digital value of the net user's capacity in real time and/or a digital binary flag indicating the proximity status based on a programmable threshold.

A limitation of the known system is that, the sensor's capacity may vary not only due to the approach of a user, but also because the device may be placed close to a high-permittivity object, for example a wood or glass table. In such situation, if the sensor is close enough to the support surface, the increase in capacity may induce the system to decide erroneously that it is close to a human body, and limit the RF output power. In this case, the connectivity is unnecessarily degraded.

Known systems may attempt to discriminate between a human body part and an inanimate object based on the quantitative differences in the capacity increase. Electrical permittivity of the human body is considerably higher than that of wood, glass, plastic and many other material, and it is fair to expect that the capacity will increase more when the device is close to the body then when it is close to a tabletop. The capacity of an inanimate object may vary within wide limits, however, dependent on the size, the minimal distance, and the presence of conductive parts, such that these methods do not provide a reliable discrimination.

Methods and systems using several sensor to achieve this desirable discrimination have been proposed, among others, US2016057578 and US2014015595 in the name of the present applicant. Although effective to an extent, the multiplication of electrode may not be sufficient to decide without ambiguity whether a human body is close, and is an added complexity.

It is therefore an aim of the present invention to provide a discrimination method for inanimate object in a capacitive proximity detector that overcomes the above limitation. The invention also proposes a proximity detector, preferably integrated in an integrated circuit, that is capable of providing an binary flag that is active when a human body, but not an inanimate object is in proximity, as well as a portable connected device with a radio wireless interface, whose emission power is adapted in consideration of the proximity of an human body.

BRIEF SUMMARY OF THE INVENTION

According to the invention, these aims are achieved by means of the object of the attached claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1A:
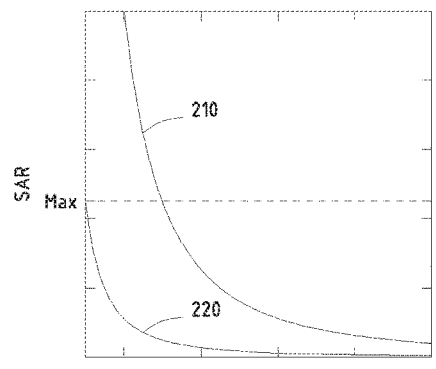
FIGS. 1*a* and 1*b* plot the SAR levels from a portable connected device.

FIG. 1*a* shows the known relationship between the SAR as a function of the distance between the transmitter antenna and the user's body. Curve 210 may represent the Specific Absorption Rate associated with a conventional cellphone transmitting at full RF power. It is apparent that the absorption rate exceeds the statutory absorption rate limit (Max) for small distances.

Curve 220 represents the absorption rate in a phone associated with a phone whose RF power has been deliberately reduced. Clearly the rate complies with statutory limits but, since the power is lower, the connectivity of the phone will be degraded.

Figure 1B:
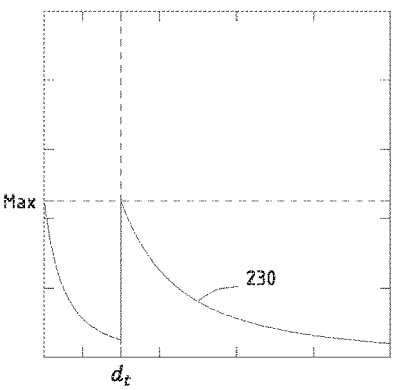

FIG. 1*b* illustrates a known solution to the above dilemma. The connected device is equipped with a proximity detector that measures the distance d to the user. A hardware or software processor in the device generates a logical signal when the distance sinks below a predetermined limit $d_t$ that triggers a momentary reduction of the RF power, as shown by plot 230. In this manner the device suffers no degradation of the connectivity when the distance d is large enough that the SAR is below the maximum acceptable limit, and the power is reduced only when it is required. Although FIG. 1*b* shows only one threshold $d_t$, it should be understood that the device could determine the distance in relation to several threshold values, and reduce the power in several progressive steps, in a search of the best connectivity compatible with the SAR limit at any given distance.

Figure 2:
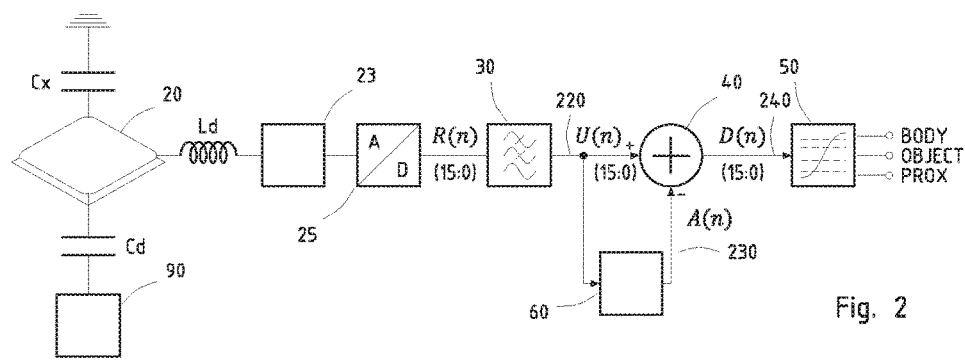
FIG. 2 illustrates schematically a capacitive proximity sensor in a portable connected device.

FIG. 2 shows schematically a capacitive proximity detector in a connected portable device such as a portable phone, laptop computer, or tablet, but it should be understood that the filter and the method of the invention could be applied to diverse fields.

The detector is sensitive to the capacity Cx of an electrode 20 that will increase slightly at the approach of a user's hand, face or body. The variations due to body proximity are overshadowed by the own capacity of the electrode 20 which, in turn, is not stable. The capacity signal is preferably amplified and processed by an analogue processor 23, which may also subtract a programmable offset, and converted into raw digital values by an A/D converter 25. The samples $R_n$ may be encoded as 16 bits integers, or in any other suitable format.

The raw samples R(n) contain also, in a non-ideal world, noise and unwanted disturbances that are attenuated by a filter 30. The filter 30 may be a digital low-pass filter, dimensioned in consideration of the bandwidth of the expected signal, or any other suitable filter. The filter 30 provides a series of samples $U_n$ useful for the processing in the successive stages.

The unit 60 is a baseline estimator that generates a series of samples A(n) that approximate the instantaneous value of the baseline, considering drift. This is then subtracted from the U(n) samples in difference unit 40 and provides the drift-corrected samples D(n). A discriminator unit 50 then generates a binary value 'PROX' that indicates the proximity of the user's hand, face, or body. The invention is not limited to a binary output, however, and encompasses detectors that generate multi-bit proximity values as well.

Figure 4:
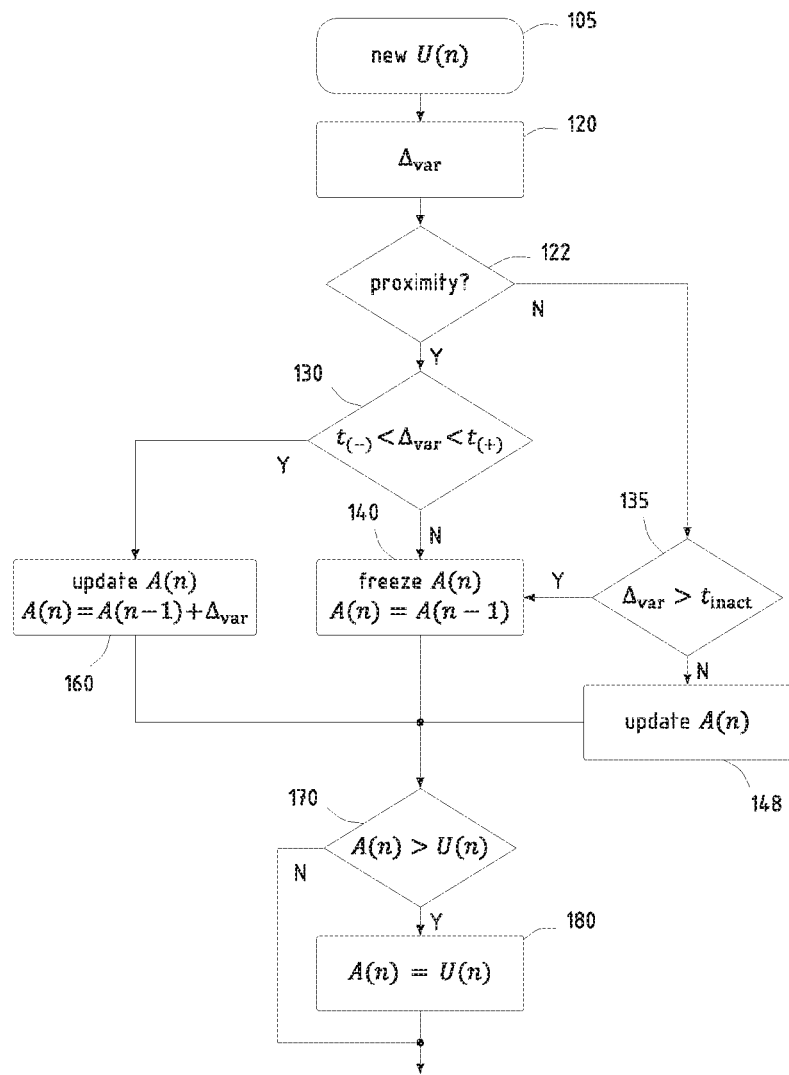
FIG. 4 is a flowchart describing an optional baseline estimation method.

In an optional variant of the invention, the baseline estimator 60 includes a drift compensation unit arranged to track and subtract a drift from the proximity signal generating a drift-compensated signal by: measuring a variation of the proximity signal in a determined time interval, freezing the tracking of the drift when the logical PROX value is asserted and the variation is not in a predetermined acceptance region, or the variation is in a predetermined freezing region, as represented in FIG. 4.

Should the capacitive proximity sensor be part of a connected portable device for SAR control, the sensor electrode 20 will preferably be placed close to the transmitting antenna of the RF transmitter, to determine accurately the distance from the radio source. The sensor electrode 20 could be realized by a conductor on a printed circuit board or on a flexible circuit board, and may have guard electrodes on the back and at the sides, to suppress detection of bodies and objects at the back or on the sides of the device.

In the same application, the capacitive electrode 20 could serve also as RF antenna, or part thereof. FIG. 2 shows this feature of the invention. The electrode 20 is connected, through a decoupling capacitor Cd, to a radio transmitter and receiver unit 90, and has an inductor Ld, or another RF-blocking element, to block the radiofrequency signal. Otherwise, the radio unit 90 could be connected to an antenna separate and independent from the sense electrode 20 which, in this case, could be connected directly to the analogue interface 23 without the decoupling inductor Ld.

The present invention relates to a method of processing a proximity signal, for example D(n) and setting the RF power of transmitter 90 in dependence from proximity of a human body part, without considering proximity of inanimate objects like, for example a table.

As mentioned in the introduction, when the user brings the phone close to the body, the capacity seen by electrode 20 will increase because the electrical permittivity of the human body is considerably larger than that of the free space. Typically, the permittivity of body is typically 80 or more, thus producing a considerable increase already at a certain distance.

An inanimate object such as a table would also increase the capacity of the electrode 20 but, since the permittivity of most architectural materials like wood and laminate is between 2 and 4, the effect will be lower. Yet, a large table at very close range may be difficult to distinguish from a hand at a distance that is larger, but still less than the threshold $d_r$.

Figure 3:
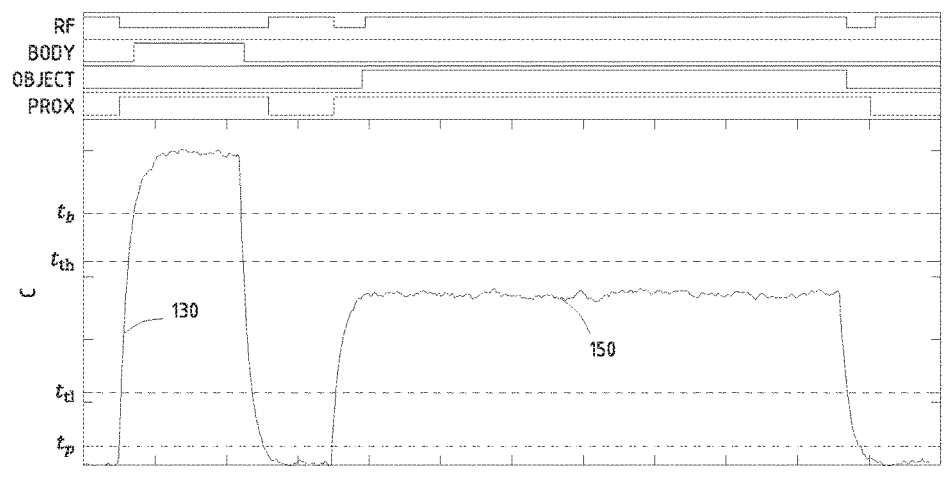
FIG. 3 is a plot of the capacity increase when the sensor approaches a human body, respectively an inanimate object.

FIG. 3 illustrates the capacitance that may be detected as a function of the time when the detector approaches a body part (peak 130) and then an inanimate object (peak 150). According to an aspect of the invention, the capacity signal is compared with four threshold values: $t_p$ is the lowest and corresponds to a value that, when it is not exceeded indicates sufficient distance from any body part that the transmitter can operate at full RF power. The highest threshold $t_b$ indicates, when it is surpassed, that the antenna is very likely close to a body part, and the power must be reduced. The intermediate thresholds $t_{tl}$ and $t_{th}$ delimitate a band of values that may be produced either by a body part or an inanimate object and, in this band, a decision is taken based on the variation of the signal. According to an aspect of the invention, when the capacity is comprised between $t_{tl}$ and $t_{th}$, the discriminator unit checks the variation of the capacity over time and determines whether the capacitance signal is stable. Stability can be judged for example by verifying that the maximum and minimum of the signal within a determined time window are not more separate than a given value, or in any other suitable way.

The detector of the invention may generate the following logical signals conventionally denoted by PROX, BODY, and OBJECT:

PROX, set when $C>t_p$. This correspond to the logical flag generated when the discriminator unit 50 of FIG. 2 is a conventional discriminator;

BODY, set when $C>t_b$;

OBJECT, set when $t_{tl}<C<t_{th}$ and C is stable.

The power of the RF transmitter is determined in consideration of these flags and, in particular, the flag TABLE is used as an indicator that the object that has raised the capacity is inanimate, and the power need not be reduced. In a possible implementation, if the trigger levels $t_p$, $t_{tl}$, $t_{th}$, $t_b$ are in the order represented in FIG. 3, the RF power level could be given by the following table that covers all the possible combinations of PROX, OBJECT, and BODY.

TABLE 1

| PROX | OBJECT | BODY | RF Power |
|---|---|---|---|
| 0 | 0 | 0 | FULL (no object detected) |
| 1 | 0 | 0 | REDUCED (unknown type => could be user) |
| 1 | 0 | 1 | REDUCED (user detected) |
| 1 | 1 | 0 | FULL (inanimate object detected) |

The invention claimed is:

1. A proximity detector for a connected portable device that includes a RF transmitter, the proximity detector being arranged to detect proximity of a human body part to the portable device and generate an instruction to set a power of the RF transmitter to a reduced value based on a capacity seen by a sensor electrode of the proximity detector, wherein the proximity detector is arranged to determine a time variation of the capacity, and to set the power of the RF transmitter to a full value, higher than the reduced value, when the time capacity seen by the sensor electrode is between a lower object threshold and a upper object threshold, and the variation of the capacity does not exceed a determined maximum level of variation.

2. The proximity detector of claim 1, wherein the time variation of the capacity is determined as the difference from a maximum value and a minimum value in a predetermined time window.

3. The proximity detector of claim 1, being arranged to raise an object detection flag when the capacity seen by the sensor electrode is between the lower object threshold and the upper object threshold, and the variation of the capacity does not exceed the determined maximum level of variation.

4. The proximity detector of claim 1, arranged to raise a body proximity flag that sets the power of the RF transmitter to the reduced value when the capacity is above a determined body detection threshold, higher than said upper object threshold detection level.

5. The proximity detector of claim 1, arranged to raise a proximity flag when the capacity is above a determined proximity threshold lower than said lower object threshold.

6. The proximity detector of claim 1, arranged to raise: an object detection flag when the time capacity seen by the sensor electrode is between the lower object threshold and the upper object threshold, and the variation of the capacity does not exceed the determined the maximum level of variation; a body proximity flag that sets the power of the RF transmitter to the reduced value when the capacity is above a determined body detection threshold, higher than said upper object threshold detection level; a proximity flag when the capacity is above a determined proximity threshold lower than said lower object threshold, and to set the RF power to the reduced level when either the proximity flag is raised and the object detection flag is not raised, or the body detection flag is raised.

7. The proximity detector of claim 1, including an analogue/digital converter that generates a digital signal representing the capacity seen by the sensor electrode, and a digital processor arranged to set the power of the RF transmitter based on said digital signal.

8. The proximity detector of claim 1, including an analogue pre-processor generating a voltage based on the capacity seen by the sensor electrode.

9. The proximity detector of claim 1, wherein the sensor electrode is a conductor on a printed-circuit board.

10. A portable connected device having a RF transmitter and a proximity detector, the proximity detector being arranged to detect proximity of a human body part to the portable device and generate an instruction to set a power of the RF transmitter to a reduced value based on a capacity seen by a sensor electrode of the proximity detector, wherein the proximity detector is arranged to determine a time variation of the capacity, and to set the power of the RF transmitter to a full value, higher than the reduced value, when the time capacity seen by the sensor electrode is between a lower object threshold and a upper object threshold, and the variation of the capacity does not exceed a determined maximum level of variation.

11. The portable connected device of claim 10, being a telephone, a laptop, or a tablet.

12. The portable connected device of claim 10, wherein the sensor electrode is connected to the proximity detector through a RF-blocking element, and the RF transmitter is connected also to the sensor electrode, wherein the sensor electrode radiates radio signals.

\* \* \* \* \*